United States Patent

Bång

[11] Patent Number: 5,959,558
[45] Date of Patent: Sep. 28, 1999

[54] METHOD AND AN ARRANGEMENT RELATING TO COMMUNICATION SYSTEMS

[75] Inventor: Karl G. Bång, Järfälla, Sweden

[73] Assignee: Telefonaktiebolaget LM Ericsson, Stockholm, Sweden

[21] Appl. No.: 08/756,816

[22] Filed: Nov. 26, 1996

[30] Foreign Application Priority Data

Nov. 29, 1995 [SE] Sweden .................................. 9504270

[51] Int. Cl.⁶ ..................................................... H03M 7/14
[52] U.S. Cl. ............................................. 341/96; 341/107
[58] Field of Search .................. 341/94, 96, 97, 341/98, 107

[56] References Cited

U.S. PATENT DOCUMENTS

| | | | |
|---|---|---|---|
| 3,678,389 | 7/1972 | Heers et al. | 341/96 |
| 4,733,220 | 3/1988 | Knierim | 341/97 |
| 4,975,698 | 12/1990 | Kagey | 341/96 |
| 5,298,896 | 3/1994 | Lei et al. | 341/51 |
| 5,300,930 | 4/1994 | Burger et al. | 341/96 |
| 5,329,280 | 7/1994 | Amuro | 341/96 |

FOREIGN PATENT DOCUMENTS

4124483 C1  12/1990  Germany .

OTHER PUBLICATIONS

Bingham, John A.G., "The Theory and Practice of Modem Design", John Wiley & Sons, 1988 (pp. 65–66).
Lee, E.A. et al., "Digital Communication", Kluwer Academic Publishers, Bosten, 1988 (p. 193).

*Primary Examiner*—Marc S. Hoff
*Attorney, Agent, or Firm*—Buens, Doane, Swecker & Mathis, L.L.P.

[57] ABSTRACT

A coding scheme for coding information having a nonuniform probability distribution function. According to exemplary embodiments, a code word is assigned to the information corresponding to the peak level of the probability density function, and is referred to as the kernel. New code words having a Hamming distance of 1 to the kernel are then assigned to information adjacent to the peak level of the probability density function. The new code words are arranged around the kernel in as compact a manner as possible. If there are forbidden code words, the kernel is selected appropriately and the forbidden words are omitted from the resulting code table.

8 Claims, 4 Drawing Sheets

PRIOR ART

METHOD AND AN ARRANGEMENT RELATING TO COMMUNICATION SYSTEMS

FIELD OF THE INVENTION

The present invention relates generally to coding schemes or encoding digital information. More particularly, the present invention provides a fixed-length bit error coding scheme that is particularly suitable for coding information having a non-uniform probability distribution for transmission over a telecommunications channel.

BACKGROUND OF THE INVENTION

For transmitting information over a telecommunications channel, digital information is typically coded and transmitted in the form of code words. An exemplary binary encoding method with a substantially uniform rate is described in U.S. Pat. No. 5,300,930. It is often desirable to encode the digital information using as few bits as possible in order to minimize the bandwidth required. Depending on the probability distribution of the events described by the digital information, the information can be encoded such that events that occur rarely are coded with longer code words and events that occur frequently are coded with shorter code words. The encoding is preferably done in such a manner that the decoder can distinguish between the different code words.

However, a typical transmission channel between a transmitter and a receiver introduces bit errors, and it is difficult for the decoder (at the receiver) to reliably decode the different variable length code words because the encoder cannot determine where one code word starts and another ends. Usually this problem is solved by channel coding, where controlled repetition or redundancy is introduced by the channel encoder. The repetition of code words enables the channel decoder to detect and correct erroneous bits.

Using this method, more bits have to be transmitted over the channel. The channel bit rate increases, and the channel encoder and decoder must necessarily be more complex. Moreover, at bit error rates higher than the error correcting capacity of the channel coding, the decoded bit error rate often becomes worse than the uncoded bit error rate. Such a threshold bit error rate exists for every code, based on either the Shannon capacity formula or on a restriction in acceptable delay due to channel coding.

A fixed length code overcomes some of the disadvantages of a variable length code, in terms of bit error robustness. While some efficiency is lost because all code words have the same length independent of the probability distribution of the information to be coded, each code word can be decoded independent of any other code word once synchronization is achieved.

To implement a fixed length coding scheme, the information to be transmitted is assumed to represent a 'level curve' monotonically increasing from a minimum value to a maximum value. The events described by the information represent discrete points on this level curve and each point is coded with a fixed length code word. A bit error in a code word causes a jump in the level curve the magnitude of which depends on which bit in the code word is erroneous. This means that some bit errors (at certain positions in the code word) may result in an acceptable decoded level (small level error) while other error bits in a code word results in a totally unacceptable level change.

A recommended standard for Very Low Bitrate Video Telephony over a mobile channel is currently being developed. According to current proposals for the standard, two 8-bits fixed length code tables provide essentially a 'straight forward' code, such that the index of the level function is represented as a binary value and used as a code word. It would be desirable to improve the error robustness of the fixed length code tables in video telephony applications. It would further be desirable to design a code table with a gain in mean squared error (mse) (compared to the 'straight forward code') for probability density functions (pdfs) having a rather sharp peak, since the chrominance (color difference) components represented by the fixed length tables usually have a very pronounced peak.

It is known to improve fixed length code robustness to bit errors by means of Gray coding, which can be described in detail in the following references: John A. G. Bingham, "The Theory and Practice of Modem Design", John Wiley & Sons, 1988 (pp. 65–66); and E. A. Lee, D. G. Messerschmitt, "Digital Communication", Kluwer Academic Publishers Boston, 1988 (p. 193).

Gray codes have the property that adjacent data are encoded into code words that differ by only one bit, i.e. the Hamming distance is 1. This is particularly effective for a 2-bit code (4 words) in a 2-dimensional signal constellation, where the Euclidean distance is at a minimum for code words with Hamming distance=1, as in FIG. 1.

In a 1-dimensional representation, when each code word represents a level, the result is different, as illustrated with the following 3-bit codes with 8 levels. A straight code and two Gray codes with associated bit error distances are shown in Table 1. The distance d1 is the sum of the distances obtained by changing one bit at a time in the code word. The mean distance per bit is then d⅓ units.

TABLE 1

| | Straight Code | | Gray Code 1 | | Gray Code 2 | |
|---|---|---|---|---|---|---|
| Level | Code | Distance d1 | Code | Distance d1 | Code | Distance d1 |
| 0 | 000 | 4+2+1=7 | 000 | 5+1+3=9 | 000 | 3+1+7=11 |
| 1 | 001 | 4+2+1=7 | 010 | 5+1+1=7 | 010 | 1+1+5=7 |
| 2 | 010 | 4+2+1=7 | 011 | 5+1+1=7 | 110 | 1+1+3=7 |
| 3 | 011 | 4+2+1=7 | 001 | 1+1+3=5 | 100 | 3+1+1=5 |
| 4 | 100 | 4+2+1=7 | 101 | 1+3+1=5 | 101 | 3+1+1=5 |
| 5 | 101 | 4+2+1=7 | 100 | 5+1+1=7 | 111 | 1+1+3=5 |
| 6 | 110 | 4+2+1=7 | 110 | 5+1+1=7 | 011 | 1+1+5=7 |
| 7 | 111 | 4+2+1=7 | 111 | 5+3+1=9 | 001 | 3+1+7=11 |

Using a metric based upon the Euclidean distance, d1, or the squared Euclidean distance, d2, the following distances can be defined:

$$\varepsilon 1 = \frac{1}{n} \sum_{m=0}^{M-1} p(m) d1(m)$$

and $$\varepsilon 2 = \frac{1}{n} \sum_{m=0}^{M-1} p(m) d2(m)$$

where
n is the number of bits in each fixed-length code word,
M is the number of fixed length code words,
p(m) is the pdf of the level, m=0, 1, . . . , M-1,
$\varepsilon 1$ is the mean error distance per bit and
$\varepsilon 2$ is the mean squared distance (mse) per bit.

The mean error distance per bit is $\varepsilon 1$=7/3=2.33 units for all three codes in Table 1. Thus, for a uniform pdf, a Gray code offers no advantages over a straight code. However, if the levels 3 and 4 (2, 3, 4 and 5) are more common than the other levels, the Gray code 1 (Gray code 2) results in an increased mean error distance.

If a bit error is introduced in the straight code in Table 1, the level jump may be 1, 2 or 4 units depending on the position of the erroneous bit. This is valid for each of the 8 code words and the mean error distance is $\epsilon1=7/3=2.33$ units per bit. If the mse is used, the result becomes $\epsilon2=(1^2+2^2+4^2)/3=7$ units$^2$ per bit. These values $\epsilon1$ and $\epsilon2$ are independent of the actual pdf, and therefore this straight code may serve as a reference for other codes.

Assuming a uniform pdf for the Gray code 1 we get a mean error distance of $\epsilon1=2*(9+7+7+5)/(8*3)=7/3=2.33$ units per bit which is equal to the straight coding. The mse becomes $\epsilon2=25/3=8.33$ units$^2$ per bit.

The corresponding figures for the Gray code 2 are; mean error distance $\epsilon1=7/3=2.33$ units per bit and mse $\epsilon2=27/3=9$ units$^2$ per bit.

Thus, nothing is gained by using a Gray code instead of a straight code if the level pdf is uniform. In fact, if mse is chosen as the metric there is a performance loss.

However, if a pdf has a peak in the central part of the coding table a performance gain can be achieved by the Gray code tables.

Still, the minimum distance and the minimum squared distance are for the Gray code tables $5/3=1.67$ units per bit and $11/3=3.67$ units$^2$ per bit, respectively, and these values may be too large to be acceptable. Further, these values do not represent the minimum values that can be achieved.

It will be appreciated that sometimes a pdf does not have a peak at a central location, and may instead be of a more general shape having two or more peaks on either side of the center of the level curve.

It would therefore be desirable for a coding scheme to provide a robust, fixed-length code for encoding information having a non-uniform probability density function; that is, a pdf having a peak. It would also be desirable for a coding scheme to provide a robust, fixed-length code for encoding information having a more general pdf; that is, a pdf having multiple peaks.

SUMMARY OF THE INVENTION

The present invention provides for fixed length codes which are more robust against bit errors, in cases when the probability density function (pdf) is not uniformly distributed (that is, has a peak). A considerable gain in mean squared error (mse) can be achieved in these cases by the exemplary embodiments described herein. The actual gain depends on the number of bits in the code word and the actual pdf of the level.

The above-noted and other limitations of conventional coding schemes and methods are overcome by the present invention, which provides for a first exemplary coding scheme for generating a robust, fixed length bit error code that is particularly suitable for coding information having a nonuniform probability density function (that is, has a peak). According to exemplary embodiments, a code table is initialized by assigning a code word (the kernel) to the information corresponding to the peak of the probability density function. Additional code words are then generated by changing individual bits in a symmetrical, alternating fashion, and the new code words are assigned to the information as close to the kernel as possible. If there are forbidden code words, the kernel should be selected to maximize the Hamming distance between the forbidden code words and the kernel.

The coding scheme according to the present invention yields a code in which the mean squared distance between code words and the kernel is minimized. The distance or mean squared distance increases as the distance from the kernel increases. Therefore, the coding scheme according to the present invention is particularly useful for coding information having a nonuniform probability distribution function; that is, information having a probability distribution function with peak levels.

A second exemplary coding scheme is provided for generating a robust, fixed length code suitable for coding information having a more general pdf (that is, having multiple peaks).

BRIEF DESCRIPTION OF THE DRAWINGS

The foregoing objects, features and advantages of the present invention will be more readily understood upon reading the following detailed description in conjunction with the drawings in which.

DETAILED DESCRIPTION OF THE PREFERRED EMBODIMENTS

Figure 1:
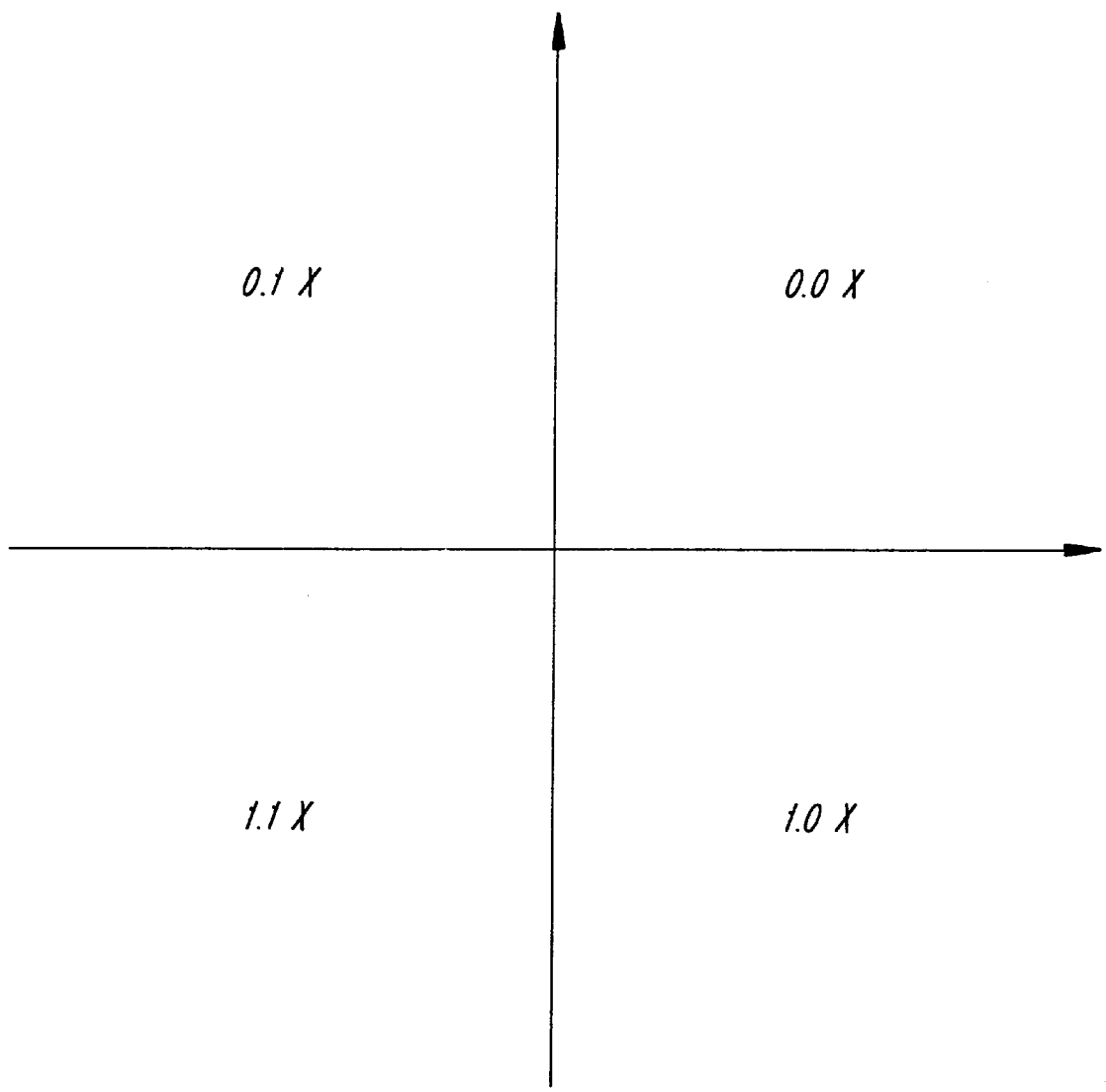
FIG. 1 is a diagram of a Gray code as known in the art.
Figure 2:
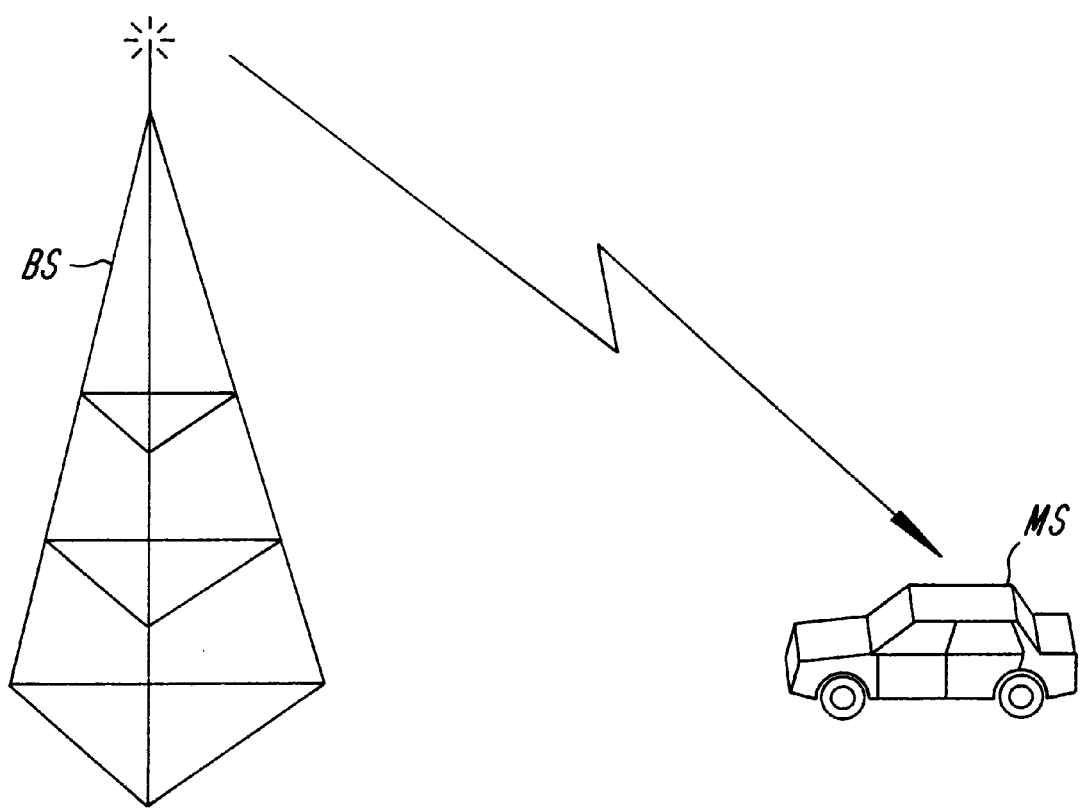
FIG. 2 is a diagram of a conventional mobile communication station.

A mobile telephone radio communication system is show in FIG. 2. A radio base station BS transmits information to and from a mobile radio terminal MS. The radio connection is shown in the figure as a zig-zag symbol between the radio base station BS and the mobile radio terminal MS.

Figure 3:
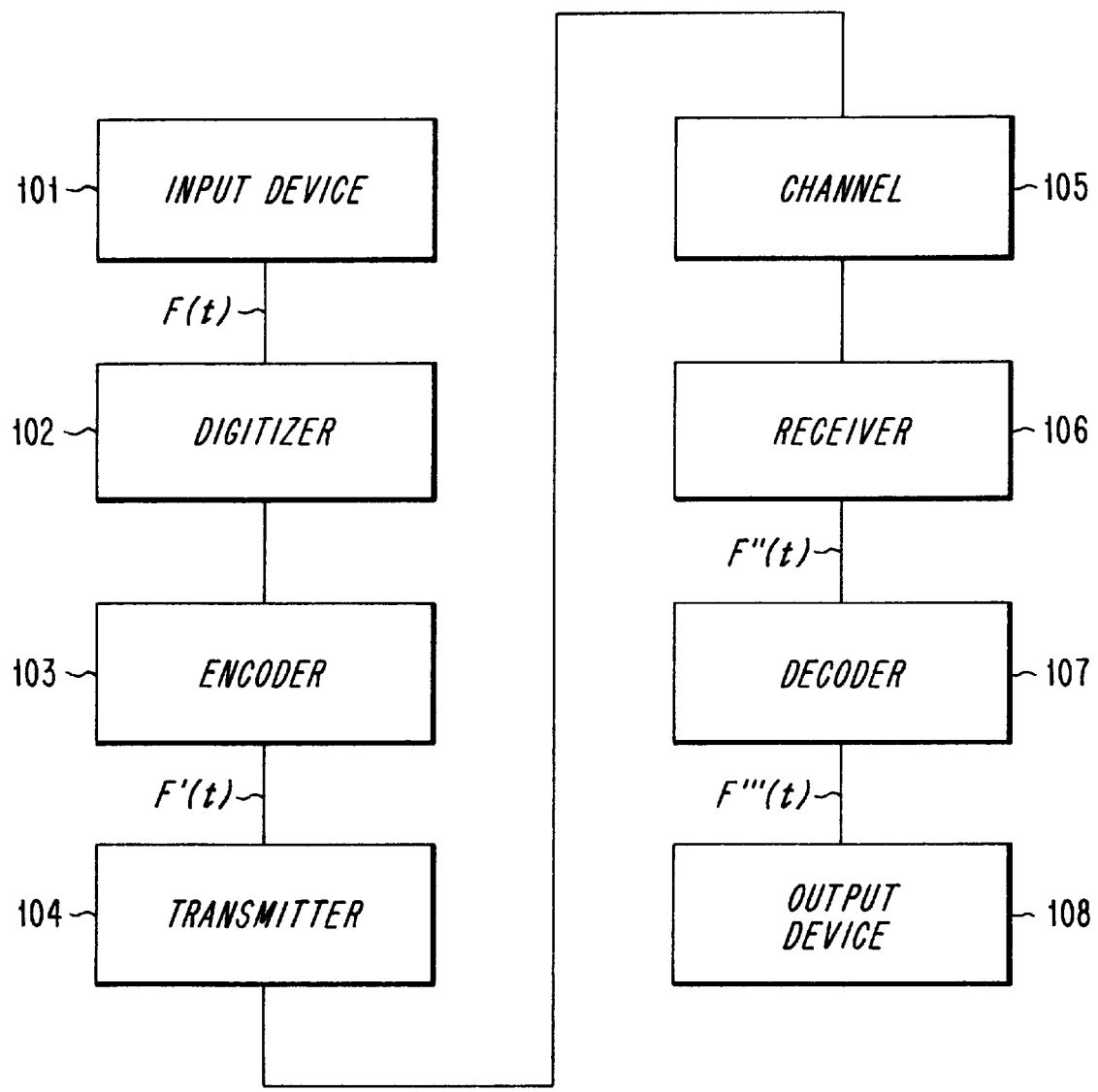
FIG. 3 is a block diagram illustrating the flow of information from a base station to a mobile station.

FIG. 3 is a block diagram illustrating the components involved in transferring from the radio base BS to the mobile radio terminal MS in the system of FIG. 2. An input device 101 can be, e.g., a video camera connected to the radio base station shown in FIG. 2. A digitizer 102 is connected to the input device. An encoder 103 in accordance with the invention is connected to the digitizer, and a transmitter 104 is connected to the encoder 103. Components 102–104 are parts of the radio base station BS. Block 105 illustrates the channel on which information is transmitted from the radio base station BS to the mobile radio terminal MS. The channel is a radio channel of 9.6 kbits/s which is subject to, e.g., Rayleigh fading. A receiver 106 is located in the mobile radio terminal MS, and is connected to a decoder 107. Output device 108 can be, e.g., a video monitor. The input device 101 generates a variable that is a function of time F(t). In this example, the probability density function for values of F(t) occurring in said information source has a maximum. The digitizer 102 and the encoder 103 perform digitization and encoding of F(t) into a function F'(t) by using a table such that the Hamming distance between code words of F'(t) that are adjacent to one another is lower for values of F(t) that are near the maximum of the probability density function than for values of F(t) that are near the maximum of the probability density function than for values of F(t) that are further away from the maximum. The transmitter 104 transmits the information in the function F'(t) over the channel 105. The information is received by the receiver 106 as F"(t) because F'(t) has been disturbed by Rayleigh fading in the channel 105. The decoder 107 decodes the received function F"(t) to generate a function F'"(t) which is similar to the original function F(t), by using a table which is the inverse of the table in the encoder 103.

A Gray code is characterized by the fact that the Hamming distance between a code word and its closest neighbor is one. If the code represents a level monotonically increasing from a minimum value to a maximum value, the Hamming distance may not be the proper metric to use for a robust code design.

According to an embodiment of the present invention, a first coding scheme (for a pdf having a peak) is provided which has a metric that reflects the level change when the different bits in a code word changes, such as the Euclidean distance or the squared Euclidean distance (the mse).

The design method for a preferred first code according to the present invention is illustrated using a 3 bit code table. It is assumed that the pdf or at least the position of the peak of the pdf representing the level curve is known.

First, the code table is initialized by selecting a code word, for example 111, as the kernel value. The kernel is assigned to the level position that corresponds to the peak of the level pdf, for example, level 3.

| Level | Code Word |
|-------|-----------|
| 3     | 111       |

Next, two new code words are assigned to the level positions adjacent to the peak level position. The Hamming distance between each new code and the kernel is 1. The new codes can be generated by changing the leftmost bit first and then the next bit in order, as shown in the following table. It will be appreciated that any bit change order can be used.

| Level | Code Word | Distance d1 |
|-------|-----------|-------------|
| 2     | 011       |             |
| 3     | 111       | 1+1+?=?     |
| 4     | 101       |             |

The third bit, the rightmost bit of the kernel, is then changed and the new codeword is assigned to level 1 (or level 5)

| Level | Code Word | Distance d1 | d2 |
|-------|-----------|-------------|-----|
| 1     | 110       |             |     |
| 2     | 011       |             |     |
| 3     | 111       | 1+1+2=4     | $1^2+1^2+2^2=6$ |
| 4     | 101       |             |     |

By performing this initialization, all code words having a Hamming distance of one are assigned to positions as close as possible (in the Euclidean distance sense) to the kernel.

If there are more than 3 bits in each of the code words, e.g. n bits, the same method is followed and the result is an initialization of (n+1) code words.

After the step of initializing the code table, the table is completed in a manner which will now be described.

The next code word to be assigned is the one closest to the kernel and with the maximum degree of freedom so that new code words can be assigned in a compact way.

For example, level 2 (code word 011) has code words on each side, but level 4 (code word 101) has a code word only on one side (111), and thus has the maximum degree of freedom. Thus, code word 101 is the 1:st reference word, and by changing the bits in the 1:st reference (101) the following table results:

| Level | Code Word | Distance d1 | d2 |
|-------|-----------|-------------|-----|
| 1     | 110       |             |     |
| 2     | 011       |             |     |
| 3     | 111       | 1+2+1=4     | 6   |
| 4     | 101       | 1+2+1=4     | 6   |
| 5     | 001       |             |     |
| 6     | 100       |             |     |

It will be appreciated that although the same bit changing order has been used here as for table initialization, any other order can be used.

If the new bit changed code word is not already assigned to some position in the table, it is assigned to a position as close as possible to the reference code word.

The step described above is repeated, so for level 2, code word 011 is chosen as the 2:nd reference, resulting in the following table:

| Level | Code Word | Distance d1 | d2 |
|-------|-----------|-------------|-----|
| 0     | 010       |             |     |
| 1     | 110       |             |     |
| 2     | —> 011    | 1+3+2=6     | 14  |
| 3     | 111       | 1+1+2=4     | 6   |
| 4     | 101       | 1+1+2=4     | 6   |
| 5     | 001       |             |     |
| 6     | 100       |             |     |

The next potential references (110 or 001) are the same distance to the kernel and the degree of freedom is the same. In this case, a symmetry principle is applied, and the code word on the opposite side of the kernel of the last processed code word is determined. In this case, level 5 with the reference word 001 is used as the reference word and the result is:

| Level | Code Word | Distance d1 | d2 |
|-------|-----------|-------------|-----|
| 0     | 010       |             |     |
| 1     | 110       |             |     |
| 2     | 011       | 1+3+2=6     | 14  |
| 3     | 111       | 1+1+2=4     | 6   |
| 4     | 101       | 1+1+2=4     | 6   |
| 5     | —> 001    | 1+3+2=6     | 14  |
| 6     | 100       |             |     |
| 7     | 000       |             |     |

As a result of this step, all 8 available code words are now associated with a level, and the distance d1(m) and mse d2(m) for the remaining 4 code words can be calculated, as shown in Table 2.

TABLE 2

|       | Straight Code | | Baang-1 Code | | |
|-------|------|---------|------|---------|-----|
|       |      | Distance |     | Distance | |
| Level | Code | d1      | Code | d1      | d2  |
| 0     | 000  | 4+2+1=7 | 010  | 1+7+2=10 | 54 |
| 1     | 001  | 4+2+1=7 | 110  | 1+5+2=8  | 30 |

TABLE 2-continued

| | Straight Code | | Baang-1 Code | | |
|---|---|---|---|---|---|
| | | Distance | | Distance | |
| Level | Code | d1 | Code | d1 | d2 |
| 2 | 010 | 4+2+1=7 | 011 | 1+3+2=6 | 14 |
| 3 | 011 | 4+2+1=7 | 111 | 1+1+2=4 | 6 |
| 4 | 100 | 4+2+1=7 | 101 | 1+1+2=4 | 6 |
| 5 | 101 | 4+2+1=7 | 001 | 1+3+2=6 | 14 |
| 6 | 110 | 4+2+1=7 | 100 | 1+4+2=8 | 30 |
| 7 | 111 | 4+2+1=7 | 000 | 1+7+2=10 | 54 |

As will be appreciated from Table 2, the distance d2 for the straight code is 21 for each code word.

If a new code word generated from a reference and assigned according to the above principles falls outside one of the end levels, a reference word from the other side of the kernel is used. This may happen, for example, when the peak of the pdf is not in the central part of the level distribution. The following embodiment illustrates this case, where it is assumed that the peak of the pdf is at level 5.

| Level | Step 1 Code | Step 2 Code | Step 3 Code | Step 4 Code | Distance d1 |
|---|---|---|---|---|---|
| 0 | | | | 000 | 1+1+4=6 |
| 1 | | | 100 | 100 | 1+6+5=12 |
| 2 | | 010 | 010 | 010 | 5+2+2=9 |
| 3 | | 001 | 001 | → 001 | 3+1+3=7 |
| 4 | → 011 | 011 | 011 | 011 | 1+1+2=4 |
| 5 | 111 | 111 | 111 | 111 | 1+1+2=4 |
| 6 | | 101 | → 101 | 101 | 3+1+5=9 |
| 7 | | 110 | 110 | 110 | 5+6+2=13 |

Figure 4:
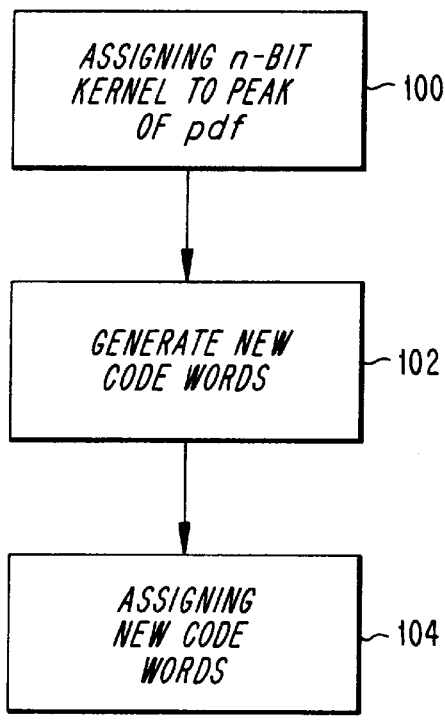
FIG. 4 is a flow chart showing an exemplary first coding scheme according to the present invention.

Referring now to FIG. 4, a flow chart describing an exemplary first coding scheme according to the present invention is shown. In step 100, a code word of n bits is selected as the kernel and is assigned to a code table position corresponding to a peak in the pdf of the information to be transmitted. In step 102, new code words are generated, each having a Hamming distance of 1 with respect to the kernel. In step 104, the new code words are assigned code table positions as close as possible to, on either side of, the kernel. To generate additional code words to complete a code table, reference words are selected in the manner described above, and new code words are generated and, if not already assigned, are assigned to code table positions as close as possible to the reference words. This process continues as described until a code table is completed, and the resulting code table can be used to encode information having a nonuniform probability density function for transmission over a telecommunication channel.

An exemplary second coding scheme that can be used for a pdf having a more general shape (multiple peaks) will now be described using a 4 bit code (n=4).

First, the code table is initialized by selecting a (n-1) bit code word, for example 111, as the kernel, and assigning the kernel to the level position that corresponds to the peak of the level pdf, which is assumed to be level 8.

| Level | Code Word |
|---|---|
| 8 | 111 |

Next, a maximum of (n-1) new code words with Hamming distance one from the kernel are generated and assigned to positions at distances $d=[d_1, d_2, \ldots d_k]$ units from the kernel. In this example, $d_1=1$, $d_2=3$ and $d_3=5$ as follows:

| Level | Code Cord |
|---|---|
| 3 | 011 |
| 4 | |
| 5 | 101 |
| 6 | |
| 7 | 110 |
| 8 | 111 (kernel) |

| Level | Code Cord |
|---|---|
| 3 | 011 |
| 4 | |
| 5 | 101 |
| 6 | |
| 7 | 110 |
| 8 | 111 (kernel) |

The code table is completed from the kernel and upwards, using the code word associated with the distance $d_1$ as the 1:st reference, i.e. 110. (The index in the distance measure is taken as the order in which the references are processed).

Changing the bits in the 1:st reference and assigning the new words as close as possible to the kernel yields the following:

| Level | Code Word |
|---|---|
| 3 | 011 |
| 4 | 100 |
| 5 | 101 |
| 6 | 010 |
| 7 | → 110 |
| 8 | 111 |

Next the code word associated with $d_2$, 101, is used as a reference, resulting in:

| Level | Code Word |
|---|---|
| 2 | 001 |
| 3 | 011 |
| 4 | 100 |
| 5 | → 101 |
| 6 | 010 |
| 7 | 110 |
| 8 | 111 |

The next reference is the code word corresponding to $d_3$, 011, which does not result in any new code word.

Next using the code word next to the kernel as a reference, 110, the bits are changed and the table is filled with new code words assigned as close as possible to the kernel. In this case 110 does not give any new code word and so the process continues with the next code word counted from the kernel, namely 010.

| Level | Code Word |
|---|---|
| 1 | 000 |
| 2 | 001 |
| 3 | 011 |
| 4 | 100 |
| 5 | 101 |
| 6 | —> 010 |
| 7 | 110 |
| 8 | 111 | yielding a code table using all 8 code words.

To obtain the 16 possible code words necessary for the 4 bit code, the mirror image of the 8 code words below the 8:th word (or above the 1:st word) are given a 1 (or 0) at the leftmost position (or rightmost position, or any position) of the 8 original words and a 0 (or 1) at the same bit position in the reflected 8 words. One implementation is given by the following table:

| Level | Code Word | Distance d1 |
|---|---|---|
| 1 | 1000 | 24 |
| 2 | 1001 | 18 |
| 3 | 1011 | 18 |
| 4 | 1100 | 16 |
| 5 | 1101 | 14 |
| 6 | 1010 | 12 |
| 7 | 1110 | 8 |
| 8 | 1111 | 10 |
| 9 | 0111 | 10 |
| 10 | 0110 | 8 |
| 11 | 0010 | 12 |
| 12 | 0101 | 14 |
| 13 | 0100 | 16 |
| 14 | 0011 | 18 |
| 15 | 0001 | 18 |
| 16 | 0000 | 24 |

The coding scheme of the present invention ensures a symmetrical distance distribution d1(m) and d2(m) and allows the flexibility to adapt the distance distribution to the actual pdf of the level, such that a small distance is allocated to the peak(s) of the pdf. This leads to a small mean error distance per bit $\epsilon 1$ and squared distance per bit $\epsilon 2$.

Forbidden code words are removed from the table. If there are forbidden code words in the code table, the kernel should preferably be chosen such that the Hamming distance between the kernel and the forbidden code word(s) is maximized. For example, if 000 is a forbidden word, the kernel should be selected as 111. Preferably, the omitted code words are positioned at one of the ends of the code table, where the pdf is presumably small. If the forbidden words are not positioned at one of the ends of the code table, an alternate bit changing order may be desirable.

To illustrate the flexibility of the exemplary second coding scheme, Table 3 shows 2 different 4 bit code tables based on the two initialization vectors $d_a$=[1 3 7] and $d_b$=[1 2 3], and shows the metric d2(m) (mse). The kernel is chosen as 111.

| Level m | Code $d_a$ | d2(m) | Code $d_b$ | d2(m) |
|---|---|---|---|---|
| 1 | 1011 | 287 | 1000 | 239 |
| 2 | 1000 | 190 | 1001 | 195 |
| 3 | 1001 | 130 | 1010 | 145 |
| 4 | 1010 | 103 | 1100 | 103 |
| 5 | 1101 | 63 | 1011 | 71 |
| 6 | 1100 | 43 | 1101 | 49 |
| 7 | 1110 | 20 | 1110 | 35 |
| 8 | 1111 | 60 | 1111 | 15 |
| 9 | 0111 | 60 | 0111 | 15 |
| 10 | 0110 | 20 | 0110 | 35 |
| 11 | 0100 | 43 | 0101 | 49 |
| 12 | 0101 | 63 | 0011 | 71 |
| 13 | 0010 | 103 | 0100 | 103 |
| 14 | 0001 | 130 | 0010 | 145 |
| 15 | 0000 | 190 | 0001 | 195 |
| 16 | 0011 | 287 | 0000 | 239 |

By way of comparison, a straight code has d2(m)=85 for each code word.

It will be appreciated that the bit-columns of the code tables can be changed in any order without changing the metric (distance). It will also be appreciated that ones can be exchanged with zeros and vice versa without changing the metric.

As previously described, the exemplary first coding scheme of the present invention provides the minimum distance (or mse) to code words with Hamming distance one, i.e. for code words with single bit errors, from the kernel. Alternative code words on each side of the kernel are determined in such a way that the levels associated with the Hamming distance to the code word considered are minimized. The kernel has the least possible distance (or mse), and the distance measure (or mse) increases as the distance from the kernel increases. The code of the present invention is particularly useful for representing information that has a peak in its pdf. Although the design method has been described, for illustrative purposes as a short 3-bit code, the same design principle is applicable for longer codes. Furthermore, the maximum gain compared to a straight code increases with the length of the code words.

Figure 5:
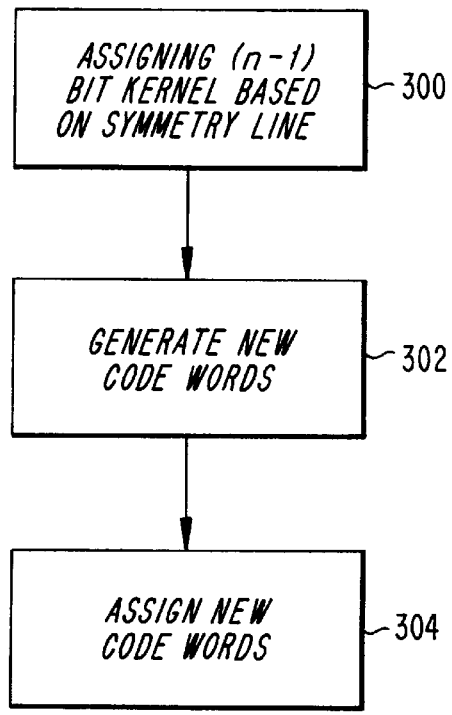
FIG. 5 is a flow chart showing an exemplary second coding scheme according to the present invention.

The exemplary second coding scheme for general pdfs enables the error distances to the peak(s) of the pdf to be adjusted such that small error distances are allocated to the peak(s) of the pdf. This allocation can be controlled by means of the initialization process i.e. when the reference code words are assigned related to the kernel. For example, the distances $d_1, d_2, d_3, \ldots d_k$, where 0<k<n-1 and where each d-component takes on distinct integer values in the interval $[1,2^{(N-1)}-1]$. The d-values can be assigned positions where the pdf has high values. This will now be described with respect to the flow chart of FIG. 5. In step 300, the code table is initialized by selecting a kernel code word of (n-1) bits, and assigning the kernel to a code table position corresponding to a symmetry line, real or estimated, of the pdf of the information to be transmitted. In step 302, k new code words are generated, where 1<k<(n-1), where each new word has a Hamming distance of 1 relative to the kernel. In step 304, the new code words are assigned at code table positions having level distances d=($d_1, d_2, \ldots d_k$) units from the kernel. Each level distance is unique and distinct from all other level distances. Further, each level distance is of an integer value in the range $[1,2^{(N-1)}-1]$, as described above. Further, the level distances are preferably selected such that the error distances d1(m) and d2(m) are matched to the pdf of the information to be transmitted. In particular, the minimum error distances are assigned to code table positions near the kernel, and the minimum error distances increase for later-assigned code words. For the case where d=x, where x is a vector of k distinct elements in the range $[1,2^{(N-1)}1]$, the minimum error distances are used to assign code table positions away from the kernel and preferably occur in a region where the elements in x are compactly positioned. In such a case, the first reference word is selected to be the code word pointed to by $d_1$, and new words are generated having a Hamming distance of 1 relative to the first reference word. The new words are assigned code table positions as close as possible to the kernel. This process is repeated, such that a second reference word is selected to be the code word pointed to by $d_2$, new code words are generated and assigned appropriately, and so on until a final reference word pointed to by $d_k$ is reached.

If this does not result in a complete table, the code word closest to the kernel is selected as a code word, and new code words are generated and appropriately assigned to the remaining positions to complete the table.

It will be appreciated that for both types of coding schemes, depending upon whether n is odd or even, there may be an equal number of code words on either side of the kernel, or there may be more code words located on one side of the kernel than are located on the other side of the kernel. If there are more code words located on one side of the kernel than are located on the other side, the code word next to the kernel on the side of the kernel having the fewest code words is preferably selected as the first code word. If there are an equal number of code words located on either side of the kernel, then the first code word located on either side of the kernel may be selected as the kernel.

As previously mentioned, columns in the code table can be reordered in any manner without changing the distance measures. Ones can be replaced by zeros and vice versa without changing the distance measures. The initialization process can, of course, also generate new code words downwards (instead of upwards) and the code table can be generated as described above (using a symmetry principle).

A transmitter or encoder implementing a coding scheme in accordance with the invention preferably includes means for assigning a new code word to the other side of the kernel in cases where the end of the code table has been reached on one side, where a new code word should be assigned according to previous steps. The transmitter or encoder also preferably includes means to terminate new code word generation when all $2^n$ code words have been generated, and means for removing any forbidden code word(s). Assuming a suitable choice of the kernel as previously described, any such forbidden words are preferably assigned to positions towards the end(s) of the code table. Many variations to the above described embodiments are of course possible and will be readily apparent to those skilled in the art based on the foregoing description. Accordingly, the disclosed embodiments should not be construed as limiting the scope of the invention.

What is claimed is:

1. A method for generating a fixed length code for a telecommunications system in which information is transmitted over a channel comprising the steps of:
   initializing a code table, by selecting a kernel code word, and assigning the kernel code word to a position corresponding to a peak of the probability density function of the transmitted information, the kernel code word having n bits and having a maximum Hamming distance to any forbidden code word(s); and
   generating n new code words with the Hamming distance one to the kernel and assigning the new code words to positions as close as possible to the kernel on either side of the kernel.

2. The method of claim 1 further comprising the steps of:
   selecting a first code word as a first reference word, the first code word being closest to the kernel such that
   when n is odd, the first code word is located on a side of the kernel that has the least number of initialized code words
   and when n is even, the first code word is located on any side of the kernel; and
   generating n new code words with Hamming distance one to the first reference word and assigning the n new code words, if not already assigned, to positions as close as possible to the first reference word.

3. The method of claim 2, further comprising the steps of:
   selecting a second reference word from an unselected side of the kernel and as close as possible to the kernel; and
   generating n new code words with Hamming distance one to the second reference word and assigning the n new code words, if not already assigned, as close as possible to the second reference word.

4. The method of claim 3, further comprising the steps of:
   selecting one or more current reference words as close as possible to the kernel in an alternating order and increasing distance from the kernel; and
   generating n new code words with Hamming distance one to a current reference word and assigning the n new code words, if not already assigned, to positions as close as possible to the current reference word.

5. The method of claim 1, wherein the information is transmitted over a radio channel.

6. The method of claim 3, wherein the information is video information.

7. A method for generating a fixed length code for encoding information to be transmitted by a transmitter over a telecommunications channel, comprising the steps of:
   initializing a code table, by selecting a kernel code word and assigning the kernel code word to a position corresponding to an estimated or real symmetry line of a probability density function of the transmitted information, the kernel code word having (n-1) bits and having a maximum Hamming distance to (n-1) bits of any forbidden code word(s);
   generating k new words, where $1 \leq k \leq (n-1)$, each new word having a Hamming distance one to the kernel, and assigning the new words at level distances $d=[d_1, d_2 \ldots d_k]$ units from the kernel, wherein
   each level distance is distinct from any other level distance, is of any integer value in the level range $[1, 2^{(n-1)}-1]$ units, and a level distance index determines the order in which the corresponding new words are processed, the level distances $d=[d_1, d_2 \ldots d_k]$ affecting the error distances d1(m) and d2(m) to match the probability density function such that for $d=[1, 2, \ldots, (n-1)]$ units, the minimum error distances d1(m) and d2(m) are assigned towards the kernel with a peak of the probability density function at the kernel, for $d=[(n-1), (n-2), \ldots, 1]$ units, the minimum error distances d1(m) and d2(m) an increased distribution compared to a previous case, and for d=x where x is a vector of k distinct elements in the range $[1,2^{(n-1)}1]$ units, the minimum error distances d1(m) and d2(m) are away from the kernel and the minimum error distances occur in a region where the elements in x are compactly positioned;
   selecting a first word pointed to by $d_1$ as a first reference word;

generating (n-1) new words with Hamming distance one to the first reference word and assigning the (n-1) new words, if not already assigned, to positions as close as possible to the kernel;

selecting a second reference word pointed to by $d_2$;

generating (n-1) new words with Hamming distance one to the second reference word and assigning the (n-1) new words, if not already assigned, to positions as close as possible to the kernel;

selecting one or more current reference words pointed to by successive elements in d, until a last element $d_k$ is reached; and generating (n-1) new words with Hamming distance one to a current reference word and assigning the (n-1) new words, if not already assigned, to positions as close as possible to the current reference word; and completing the table in cases the table is not full (with $2^{(n-1)}$ words) after said initialization process, by selecting one or more words closest to the kernel as reference words.

8. The method of claim 3, wherein the transmitter includes means for generating (n-1) new words with Hamming distance one to current reference word, and assigning the (n-1) new words, if not already assigned, to positions as close as possible to the current reference word;

means for stopping new word generation when $2^{(n-1)}$ words have been generated;

means for generating a $2^{(n-1)}$ words by flipping an existing $2^{(n-1)}$ words below the kernel;

means for putting a one (or zero) in any column position in a first set of $2^{(n-1)}$ words and a zero (or one) in the same column position in a second set of $2^{(n-1)}$ words, to generate a code table with $2^n$ code words; and means for removing forbidden code word(s) from the code table.

* * * * *